United States Patent
Huang et al.

(10) Patent No.: US 8,592,827 B2
(45) Date of Patent: Nov. 26, 2013

(54) LIGHT-EMITTING DEVICE AND THE MANUFACTURING METHOD THEREOF

(75) Inventors: Chien-Fu Huang, Chiayi (TW);
Chao-Hsing Chen, Tainan (TW);
Chiu-Lin Yao, Hsinchu (TW);
Hsin-Mao Liu, Hsinchu (TW);
Chien-Kai Chung, Tainan (TW)

(73) Assignee: Epistar Corporation, Hsinchu (TW)

( * ) Notice: Subject to any disclaimer, the term of this patent is extended or adjusted under 35 U.S.C. 154(b) by 101 days.

(21) Appl. No.: 13/225,640

(22) Filed: Sep. 6, 2011

(65) Prior Publication Data

US 2012/0056212 A1 Mar. 8, 2012

Related U.S. Application Data

(60) Provisional application No. 61/380,258, filed on Sep. 6, 2010.

(51) Int. Cl.
*H01L 27/15* (2006.01)

(52) U.S. Cl.
USPC ............................................. 257/79; 257/97

(58) Field of Classification Search
USPC ........................................................ 257/79, 97
See application file for complete search history.

(56) References Cited

U.S. PATENT DOCUMENTS

| 7,563,625 B2 * | 7/2009 | Tran et al. | 438/29 |
| 2008/0230765 A1 * | 9/2008 | Yoon et al. | 257/13 |

* cited by examiner

*Primary Examiner* — David Vu
*Assistant Examiner* — Brandon Fox
(74) *Attorney, Agent, or Firm* — Ditthavong Mori & Steiner, P.C.

(57) ABSTRACT

A light-emitting device includes: a carrier; a light-emitting structure formed on the carrier, wherein the light-emitting structure has a first surface facing the carrier, a second surface opposite to the first surface, and an active layer between the first surface and the second surface; a plurality of first trenches extended from the first surface and passing through the active layer so a plurality of light-emitting units is defined; and a plurality of second trenches extended from the second surface and passing through the active layer of each of the plurality of light-emitting units.

18 Claims, 6 Drawing Sheets

LIGHT-EMITTING DEVICE AND THE MANUFACTURING METHOD THEREOF

REFERENCE TO RELATED APPLICATION

This application is a continuation-in-part of U.S. patent application Ser. No. 61/380,258 entitled "LIGHT-EMITTING DEVICE", filed on Sep. 6, 2010, the entire contents of which are incorporated herein by reference.

TECHNICAL FIELD

The application relates to a light-emitting device and the manufacturing method thereof.

DESCRIPTION OF BACKGROUND ART

The lighting theory and the structure of the light-emitting diode (LED) is different from that of the conventional lighting source. The LED has advantages like a low power loss, a long life-time, no need for warm-up time, and fast responsive time. Moreover, it is small, shockproof, suitable for mass production, and highly compatible with the demand for the application requiring a tiny or array-type element, so LEDs are widely adopted in the market. For example, LEDs can be used in optical display apparatus, laser diodes, traffic lights, data storage devices, communication devices, illumination devices, medical devices, and so on.

Figure 1:
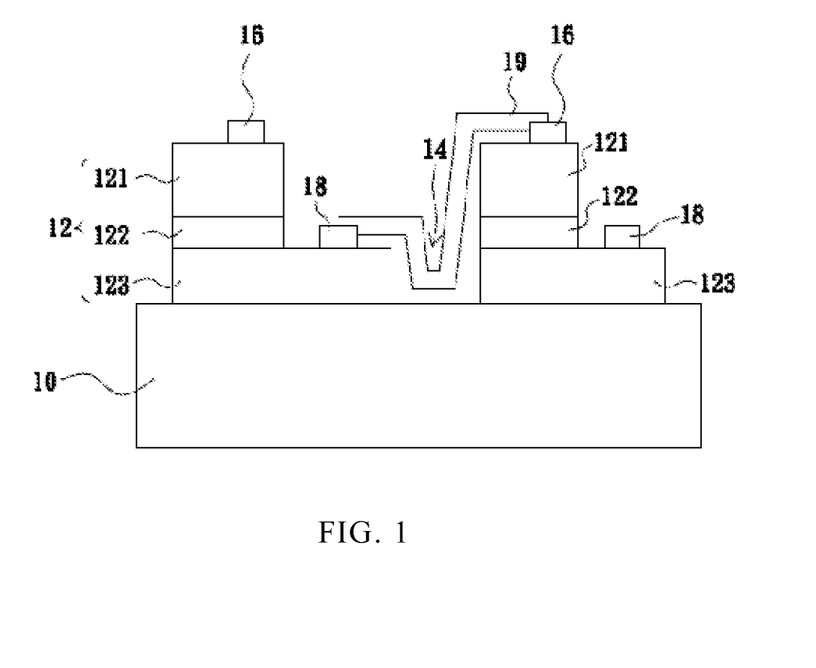
FIG. 1 is a cross-sectional view of a conventional light-emitting device.

As shown in FIG. 1, a conventional light-emitting array includes: an insulative sapphire substrate 10; a plurality of light-emitting stacks 12 formed on the insulative sapphire substrate 10 and including a p-type semiconductor layer 121, an active layer 122, and an n-type semiconductor layer 123. Because the sapphire substrate 10 is insulative, the light-emitting stacks can be insulated from each other by forming trenches therebetween with etching processes. Furthermore, after partially etching the plurality of light-emitting stacks 12 to the n-type semiconductor layer 123, a first electrode 18 is formed on the exposed area of the n-type semiconductor layer 123, and a second electrode 16 is formed on the p-type semiconductor layer 121. Metal wires 19 are then provided to selectively connect the first electrode 18 and the second electrode 16 to connect the plurality of light-emitting stacks 12 in parallel or series configuration.

SUMMARY OF THE DISCLOSURE

A light-emitting device includes: a carrier; a light-emitting structure formed on the carrier, wherein the light-emitting structure has a first surface facing the carrier, a second surface opposite to the first surface, and an active layer between the first surface and the second surface; a plurality of first trenches extended from the first surface and passing through the active layer so a plurality of light-emitting units is defined; and a plurality of second trenches extended from the second surface and passing through the active layer of each of the plurality of light-emitting units.

A light-emitting device includes: a carrier; a light-emitting structure formed on the carrier, wherein the light-emitting structure has a first surface facing the carrier, a second surface opposite to the first surface, and an active layer between the first surface and the second surface; a plurality of first trenches extended from the first surface and passing the active layer so a plurality of light-emitting units is defined; and a plurality of second trenches extended from the second surface of each of the plurality of light-emitting units, wherein each of the plurality of second trenches partially exposes the bottom of the first trench.

A manufacturing method of a light-emitting device includes steps of: providing a substrate; forming a light-emitting structure on the substrate, wherein the light-emitting structure comprises a first surface and a second surface on the substrate; and defining a plurality of light-emitting units by forming a plurality of first trenches extended from the first surface of the light-emitting structure; removing the substrate to expose the second surface; and forming a plurality of second trenches from the second surface.

DETAILED DESCRIPTION OF PREFERRED EMBODIMENTS

Figure 2A:
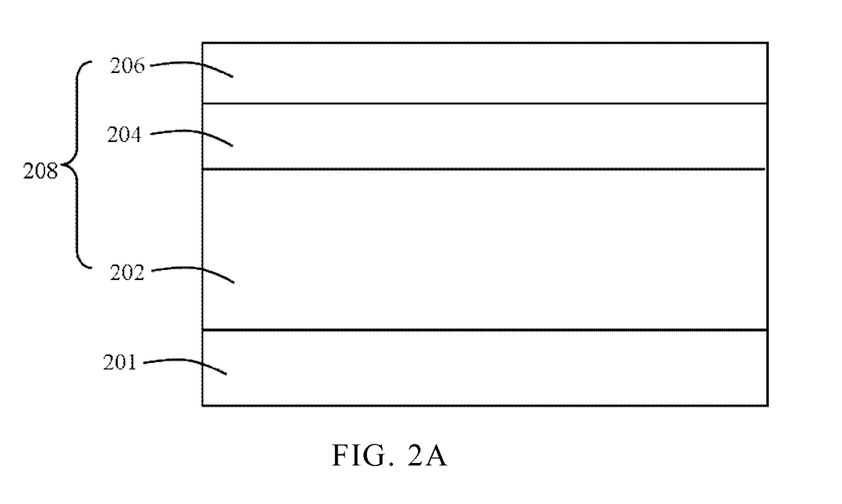
FIGS. 2A to 2H illustrate a first embodiment of a manufacturing method of a light-emitting element of an embodiment of the present application.

FIGS. 2A through 2H illustrate a method of forming a light emitting diode structure according to a first embodiment of the present application. Referring to FIG. 2A, a substrate 201 is provided. The material of the substrate 201 can be transparent material or electrically insulating material such as Sapphire, Diamond, Glass, Polymer, Epoxy, Quartz, Acryl, ZnO, or MN. The substrate 201 can also be high reflective materials such as Cu, Al, Mo, Cu—Sn, Cu—Zn, Cu—Cd, Ni—Sn, Ni—Co, Au alloy, or high thermal-dissipative materials such as Diamond Like Carbon (DLC), Graphite, carbon fiber, composite materials, Metal Matrix Composite (MMC), Ceramic Matrix Composite (CMC), Polymer Matrix Composite (PMC), Si, IP, ZnSe, GaAs, SiC, GaP, GaAsP, ZnSe, InP, LiGaO2, or LiAlO2. Then, a first semiconductor layer 202 which is an epitaxy layer of first conductivity, an active layer 204, and a second semiconductor layer 206 which is an epitaxy layer of second conductivity are formed on the substrate 201. The first semiconductor layer 202, the active layer 204 and the second semiconductor layer 206 form a light-emitting structure 208 having an exposed first surface and a second surface directly on the substrate 201. The material of the first semiconductor layer 202 and the second semiconductor layer 206 comprise indium-containing nitride semiconductor, aluminum-containing nitride semiconductor, or gallium-containing nitride semiconductor. The material of the active layer 204 comprises GaN-based material like indium gallium nitride, indium gallium aluminum phosphide, aluminum gallium nitride, aluminum gallium arsenide, or indium gallium arsenide.

Figure 2B:
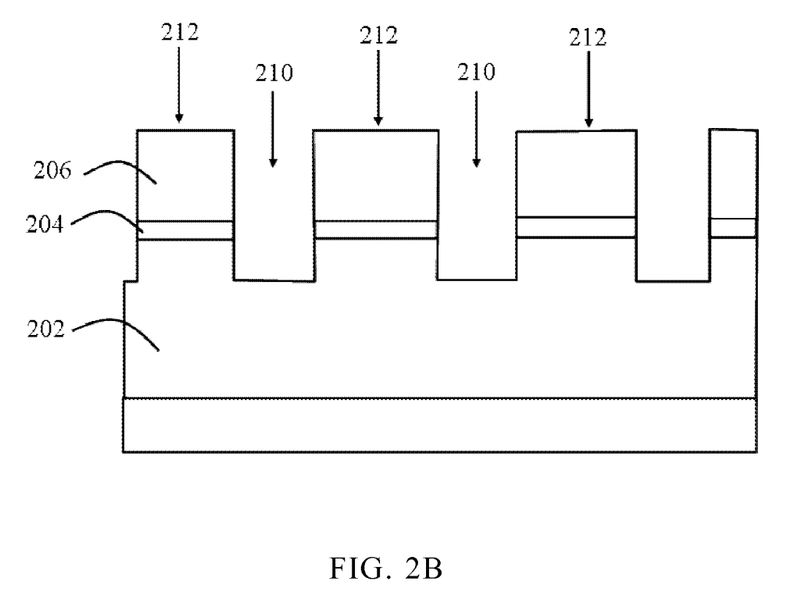

Referring to FIG. 2B, a patterning process is regionally performed to etch away the second semiconductor layer 206 and the active layer 204 until at least the surface of the first semiconductor layer 202 is exposed or partial of the first semiconductor layer 202 is removed, so the first trench 210 is formed from the surface of the second semiconductor layer 206 to the first semiconductor layer 202 to define a plurality of light-emitting units 212. The pattern is formed by the method such as photolithography, etching, and/or ICP cutting.

Figure 2C:
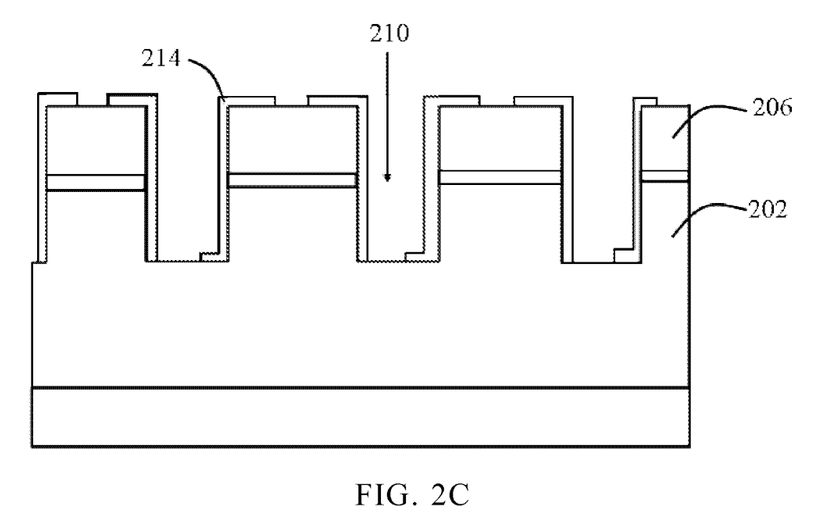

Then, covering the surfaces of the second semiconductor layer 206 and the surfaces of the first trench 210 by depositing an insulating layer 214 as shown in FIG. 2C, wherein partial of the surface of the first semiconductor layer 202 and partial of the surface of the second semiconductor layer 206 are exposed. The exposed portions such as the first connecting portions corresponding to the first semiconductor layer 202 and the second connecting portions corresponding to the second semiconductor layer 206 are used to be the electrical connection portions later. Besides, the insulating layer 214 is made of the dielectric material such as silicon nitride, silicon oxide, aluminum oxide, or the combination thereof.

Figure 2D:
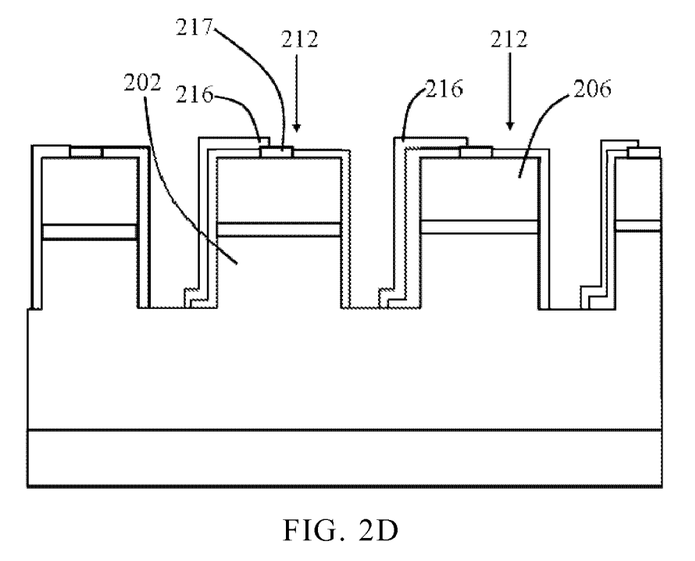

Referring to FIG. 2D, a conductive structure 216 is formed on the exposed connecting portions to electrically connect the first semiconductor layer 202 of a light-emitting unit 212 and the second semiconductor layer 206 of another light-emitting unit 212, wherein the semiconductor layers are divided into several light emitting diodes in the following steps and the divided diodes are electrically connected by the predetermined connecting portions. A contact 217 can be formed on the second semiconductor layer 206 before forming the conductive structure 216, and contact the conductive structure 216 to enhance the electrical conductivity between the conductive structure 216 and the second semiconductor layer 206.

Figure 2E:
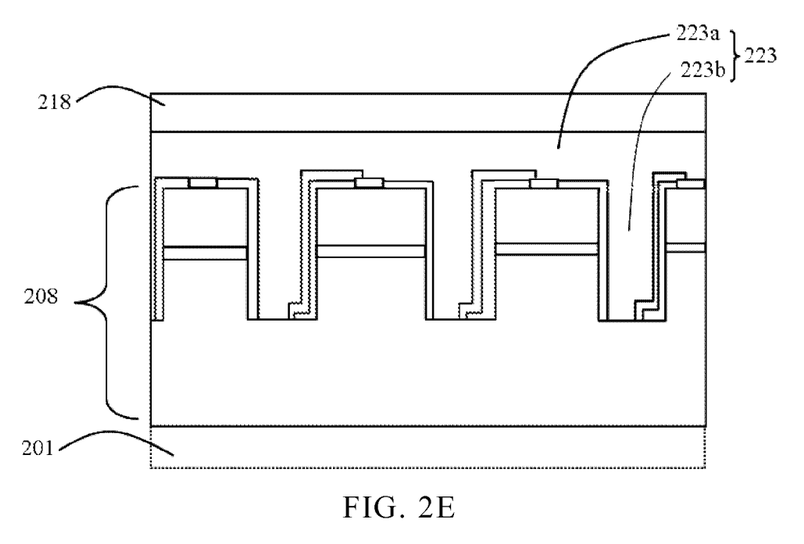

Referring to FIG. 2E, the light-emitting structure 208 is bonded to a carrier 218 by an adhesive layer 223. The adhesive layer 223 can adhesively connect the carrier 218 and the light-emitting structure 208. The adhesive layer 223 includes a base portion 223a attached on the carrier 218 and a plurality of protrusion portions 223b corresponding to each of the first trenches 210 in sectional view. In one embodiment, the adhesive layer 223 can be organic insulating material such as polyimide, BCB, PFCB, Su8, Epoxy, Acrylic Resin, COC, PMMA, PET, PC, Polyetherimide, Fluorocarbon Polymer; in another embodiment, the adhesive layer can be inorganic insulating material such as Silicone, Glass, MgO, $Al_2O_3$, $SiO_x$, $TiO_2$, $SiN_x$, SOG. The adhesive layer 223 also can be conductive material such as ITO, InO, SnO, CTO, ATO, AZO, ZTO, ZnO, AlGaAs, GaN, GaP, GaAs, GaAsP, IZO, $Ta_2O_5$, DLC, Cu, Al, In, Sn, Au, Pt, Zn, Ag, Ti, Ni, Pb, Pd, Ge, Ni, Cr, Cd, Co, Mn, Sb, Bi, Ga, Tl, Po, Ir, Re, Rh, Os, W, Li, Na, K, Be, Mg, Ca, Sr, Ba, Zr, Mo, La, Ag—Ti, Cu—Sn, Cu—Zn, Cu—Cd, Sn—Pb—Sb, Sn—Pb—Zn, Ni—Sn, Ni—Co, or Au alloy and so on. The material of the carrier 218 can be transparent material or electrically insulating material such as Sapphire, Diamond, Glass, Polymer, Epoxy, Quartz, Acryl, ZnO, or MN. The carrier 218 also can be high reflective materials such as Cu, Al, Mo, Cu—Sn, Cu—Zn, Cu—Cd, Ni—Sn, Ni—Co, Au alloy, or high thermal-dissipative materials such as Diamond Like Carbon (DLC), Graphite, carbon fiber, composite materials, Metal Matrix Composite (MMC), Ceramic Matrix Composite (CMC), Polymer Matrix Composite (PMC), Si, IP, ZnSe, GaAs, SiC, GaP, GaAsP, InP, $LiGaO_2$, or $LiAlO_2$.

Figure 2F:
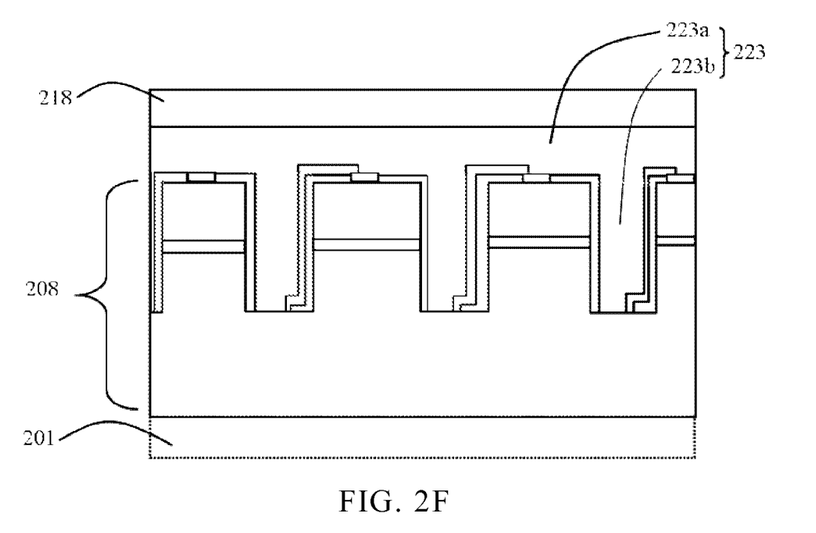

Then, the growth substrate 201 of the light-emitting structure 208 is removed, as shown in FIG. 2F, by the method such as polishing, laser lift-off, and/or etching.

Figure 2G:
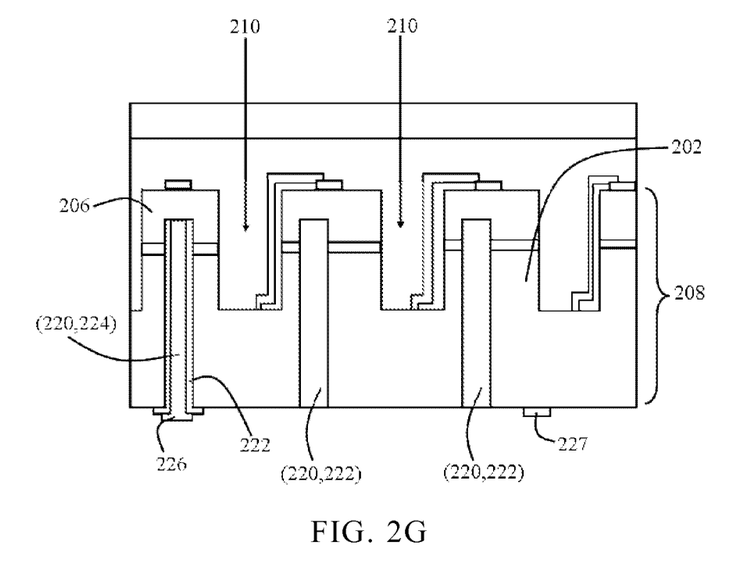

As shown in FIG. 2G, a second patterning step is performed to divide the light-emitting structure 208 into several light-emitting units 212 by forming the second trenches 220. The first semiconductor layer 202 and the active layer 204 are regionally removed to expose the surface of the second semiconductor layer 206 or partially remove the second semiconductor layer 206. Similarly, the separation step is performed by the method such as photolithography, etching, and/or ICP cutting. One of the second trenches 220 can be formed for the bonding pad formed later.

Figure 2H:
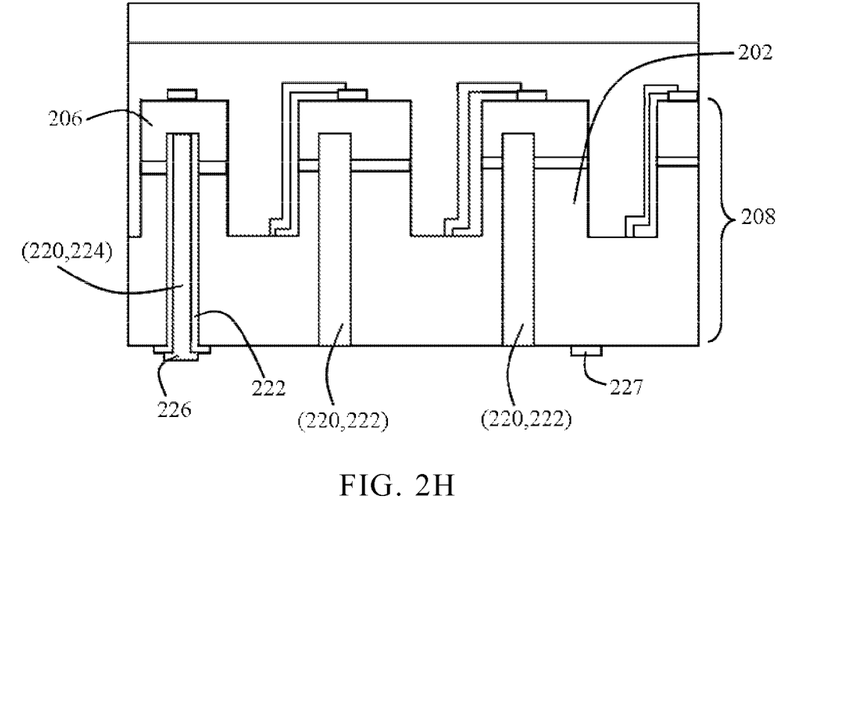

Finally, as shown in FIG. 2H, similar to the prior steps, the inner sidewalls of the second trenches 220 are covered by depositing the insulating layer 222. Then, a conductive structures 224 are formed in one of the second trenches 221 to form a bonding pad 226 to further connect the second semiconductor layer 206 of one light-emitting unit 212 in the light emitting structure 208 to another light-emitting structure. In addition, if there is no need to connect to another light-emitting structure, the second trenches 220 can be filled up with the insulating layers 222. Besides, the first bonding pad 226 electrically connected to the second semiconductor layer 206 and the second bonding pad 227 formed on the first semiconductor layer 202 can also be formed at the same step or in the different steps while the conductive structures 224 are formed.

Figure 3:
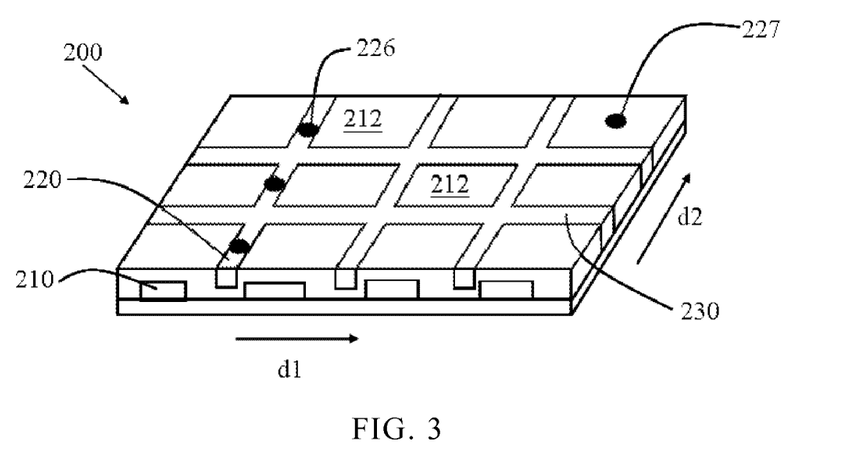
FIG. 3 is a three-dimensional view of a light-emitting element of the first embodiment of the present application.

Referring to FIG. 3, the light-emitting device 200 of the first embodiment including a plurality of light-emitting units 212 divided by the first trenches 210, the second trenches 220, and a plurality of third trenches 230. In the process of dividing the aforesaid light-emitting structures, the first trenches 210 and the second trenches 220 separate the light-emitting structure in a first dimension d1, and the third trenches 230 separate the light-emitting structure in a second dimension d2 perpendicular to the first dimension. Unlike the first trenches 210 and the second trenches 220, the third trenches 230 separate the light-emitting structure completely, and the light-emitting device 200 has multiple connections respectively connected by the light-emitting units 212 along the second dimension d2. However, in another embodiment, the third trenches 230 can be replaced by a trench structure similar to that of the first trenches and the second trenches. According to the aforesaid description, the first bonding pads 226 and the second bonding pad 227 are connected to different polarities of semiconductor layers, so the first bonding pad 227 and one of the second bonding pads 226 can be commonly connected to a power supply (not shown).

Figure 4A:
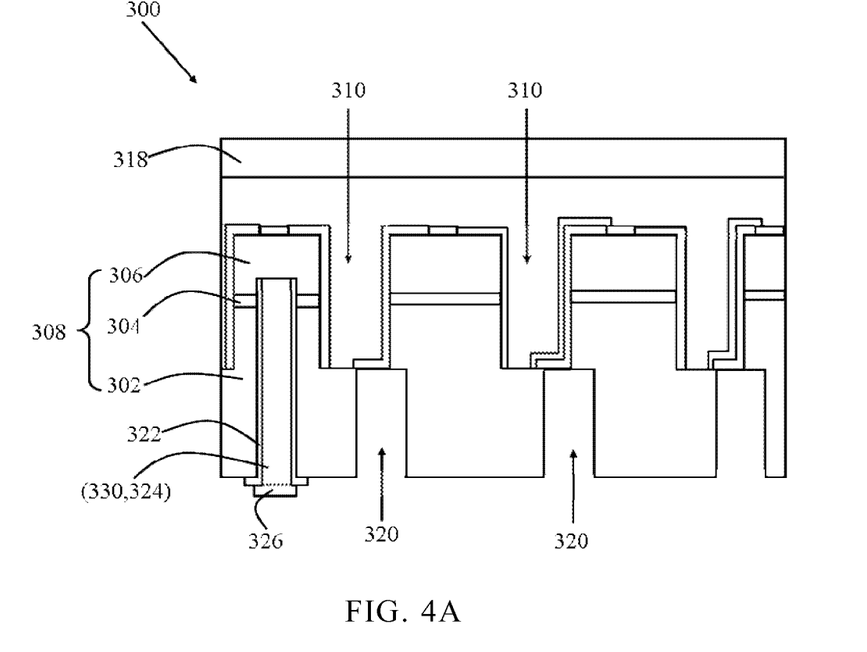
FIG. 4A is a cross-sectional view of a light-emitting element of a second embodiment of the present application.

Referring to FIG. 4A, a light-emitting device 300 includes: a carrier 318; a light-emitting structure 308 formed on the carrier 318, wherein the light-emitting structure 308 includes a first semiconductor layer 302, a second semiconductor layer 306, and an active layer 304 between the first semiconductor layer 302 and the second semiconductor layer 306; a plurality of first trenches 310 formed by regionally removing the second semiconductor layer 306 and the active layer 304 to expose the first semiconductor layer 302; a plurality of second trenches 320 formed by regionally removing the first semiconductor layer 302 to partially expose the bottom of the first trenches 310; a hole 330 formed from one side of the light-emitting structure 308 and passing the first semiconductor layer 302 and the active layer 304. The hole 330 includes an insulating layer 322 on the sidewall thereof, and a conductive structure 324 can be filled in the hole 330 and contacting the bottom of the hole 330, wherein the conductive structure 324 is insulated from the sidewall of the hole 330 by the insulating layer 322. The light-emitting device 300 can include a first bonding pad 326 connecting to the conductive structure 324, and a second bonding pad 327 on the first semiconductor layer 302 of one of the light-emitting units 312. The first bonding pad 326 and the second bonding pad 327 can be formed at the same time. The first bonding pad 326 can also be an extension of the conductive structure 324 and having the same material. In another embodiment, the material of the first bonding pad 326 can be different from that of the conductive structure 324.

Figure 4B:
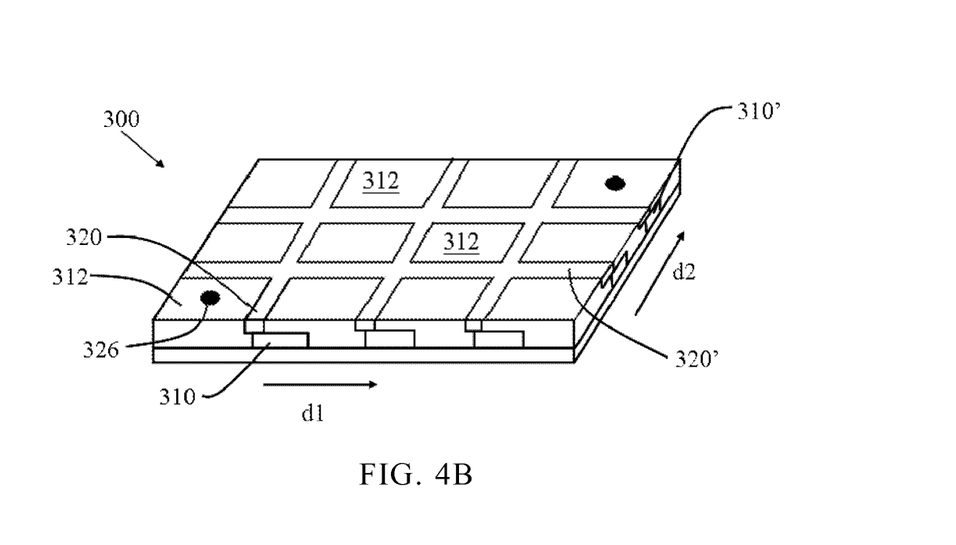
FIG. 4B is a three-dimensional view of a light-emitting element of a second embodiment of the present application.

Referring to FIG. 4B, the light-emitting structure 308 are divided into a plurality of light-emitting units 312 by the first trenches 310 and the second trenches 320 in dimension 1, and the first trenches 310' and the second trenches 320' in dimension 2. The light-emitting unit 312 having the first bonding pads 326 can be used in an AC connection for rectifying, for example, in a Wheatstone-bridge circuit. The light-emitting unit 312 having the first bonding pads 326 can represent two rectification circuits commonly connected to the common circuit of the Wheatstone-bridge circuit.

Although the present application has been explained above, it is not the limitation of the range, the sequence in practice, the material in practice, or the method in practice. Any modification or decoration for present application is not detached from the spirit and the range of such.

What is claimed is:

1. A light-emitting device comprising:
   a carrier;
   a light-emitting structure formed on the carrier, wherein the light-emitting structure has a first surface facing the carrier, a second surface opposite to the first surface, and an active layer between the first surface and the second surface;
   a plurality of first trenches extended from the first surface and passing through the active layer so a plurality of light-emitting units is defined; and
   a plurality of second trenches extended from the second surface and passing through the active layer of each of the plurality of light-emitting units,
   wherein each of the plurality of second trenches comprises an insulating layer on the sidewalls thereof.

2. The light-emitting device according to claim 1, further comprising an adhesive layer formed between the plurality of light-emitting units and the carrier.

3. The light-emitting device according to claim 2, wherein the adhesive layer comprises a base portion attached on the carrier and a plurality of protrusion portions corresponding to each of the first trenches in a sectional view.

4. The light-emitting device according to claim 2, wherein the insulating layer is disposed between the adhesive layer and the plurality of light-emitting units.

5. The light-emitting device according to claim 4, further comprising a conductive structure disposed between the insulating layer and the adhesive layer for electrically connecting the plurality of light-emitting units.

6. The light-emitting device according to claim 5, wherein each of the light-emitting units comprises a first semiconductor layer and a second semiconductor layer, and the conductive structure connected the first semiconductor layer of one of the light-emitting units to the second semiconductor layer of another one of the light-emitting units.

7. The light-emitting device according to claim 6, further comprising a contact formed on the first surface of the light-emitting unit and contacting the conductive layer.

8. The light-emitting device according to claim 1, further comprising at least a conductive structure filled in the second trench and contacting the bottom of the second trench, wherein the conductive structure is insulated from the side surface of the light-emitting unit by the insulating layer.

9. The light-emitting device according to claim 1, wherein each of the light-emitting units comprises a first semiconductor layer between the carrier and one side of the active layer, and a second semiconductor layer on the other side of the active layer.

10. The light-emitting device according to claim 9, wherein the first trench extends from the first semiconductor layer to the second semiconductor layer and exposes the second semiconductor layer, and the second trench passes through the second semiconductor layer and exposes the first semiconductor layer.

11. A manufacturing method of a light-emitting device comprising steps of:
    providing a substrate;
    forming a light-emitting structure on the substrate, wherein the light-emitting structure comprises a first surface and a second surface on the substrate;
    defining a plurality of light-emitting units by forming a plurality of first trenches extended from the first surface of the light-emitting structure;
    removing the substrate to expose the second surface;
    forming a plurality of second trenches from the second surface; and
    filling an insulating layer into the plurality of second trenches after forming the plurality of second trenches.

12. The manufacturing method of a light-emitting device according to claim 11, further comprising attaching a carrier on the first surface of the plurality of light-emitting units before removing the substrate.

13. The manufacturing method of a light-emitting device according to claim 12, further comprising forming a dielectric layer on the side wall of each of the first trenches, and conformably forming a plurality of conductive lines on the dielectric layers and connected between the plurality of light-emitting units before attaching the carrier.

14. The manufacturing method of a light-emitting device according to claim 12, further comprising forming an adhesive layer between the plurality of light-emitting units and the carrier.

15. The manufacturing method of a light-emitting device according to claim 11, further comprising forming a conductive structure filled in the second trench, wherein the conductive structure is insulated from the side surface of the light-emitting unit by the insulating layer, and contacts the bottom of the second trench.

16. The manufacturing method of a light-emitting device according to claim 15, wherein the light-emitting structure comprises a first semiconductor layer formed on the substrate, an active layer formed on the first semiconductor layer, and a second semiconductor layer formed on the active layer, and each of the first trenches is formed by regionally removing the second semiconductor layer and the active layer to expose the first semiconductor layer, and each of the second trenches is formed by regionally removing the first semiconductor layer and the active layer to expose the second semiconductor layer.

17. The manufacturing method of a light-emitting device according to claim 15, wherein the light-emitting structure comprises a first semiconductor layer formed on the substrate, an active layer formed on the first semiconductor layer, and a second semiconductor layer formed on the active layer, and each of the first trenches is formed by regionally removing the second semiconductor layer and the active layer to expose the first semiconductor layer, and each of the second trenches is formed by regionally removing the first semiconductor layer to partially expose the bottom of the first trench.

18. A light-emitting device comprising:
    a carrier;
    a light-emitting structure formed on the carrier, wherein the light-emitting structure has a first surface facing the carrier, a second surface opposite to the first surface, and an active layer between the first surface and the second surface;
    a plurality of first trenches extended from the first surface and through the active layer; and a plurality of second trenches extended from the second surface of the light-emitting structure;
wherein each of the plurality of second trenches partially exposes the bottom of the first trench.

* * * * *